(12) United States Patent
Ylamurto (10) Patent No.: US 9,432,062 B2
(45) Date of Patent: Aug. 30, 2016

(54) POLAR NOISE SHAPING

(71) Applicant: Nokia Technologies Oy, Espoo (FI)

(72) Inventor: Tommi Ylamurto, Los Gatos, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/081,862

(22) Filed: Nov. 15, 2013

(65) Prior Publication Data

US 2015/0139354 A1    May 21, 2015

(51) Int. Cl.
*H04B 1/04*     (2006.01)
*H03M 3/00*    (2006.01)

(52) U.S. Cl.
CPC .............. *H04B 1/0475* (2013.01); *H03M 3/40* (2013.01); *H03M 3/50* (2013.01)

(58) Field of Classification Search
CPC .......... H03M 1/66; H03M 1/68; H03M 3/30; H03M 3/39; H04B 1/04; H04B 1/0466; H04B 1/0475; H04B 14/004; H04B 14/006; H04B 14/008; H04B 14/044; H04B 14/046; H04B 14/06; H04B 14/062; H04L 25/06; H04L 25/08; H04L 27/04; H04L 27/20; H04L 27/2032; H04L 27/2053; H04L 27/206; H04L 27/2092
USPC ................ 375/243, 245, 247, 295–297, 308; 332/103–105, 144, 145; 341/143; 455/108, 110
See application file for complete search history.

(56) References Cited

U.S. PATENT DOCUMENTS

| | | | |
|---|---|---|---|
| 7,787,563 B2 | 8/2010 | Tal et al. | |
| 7,924,937 B2 | 4/2011 | Norsworthy et al. | |
| 2002/0085647 A1* | 7/2002 | Oishi et al. | 375/297 |
| 2002/0168019 A1* | 11/2002 | Bengtsson et al. | 375/295 |
| 2007/0201535 A1* | 8/2007 | Ahmed | 375/135 |
| 2009/0072921 A1* | 3/2009 | Schmid | H04L 27/361 332/145 |
| 2010/0272213 A1* | 10/2010 | Wurm et al. | 375/295 |

OTHER PUBLICATIONS

Chowdhury et al., "A Fully Integrated Efficient CMOS Inverse Class-D Power Amplifier for Digital Polar Transmitters," IEEE Journal of Solid-State Circuits, 47(5):1113-1122 (2012).

* cited by examiner

*Primary Examiner* — Young T Tse
(74) *Attorney, Agent, or Firm* — Mintz Levin Cohn Ferris Glovsky and Popeo, P.C.

(57) ABSTRACT

Methods and apparatus, including computer program products, are provided for polar noise shaping. In one aspect there is provided a method. The method may include receiving a first error signal representative of a first noise including a first quantization noise carried by a quadrature signal; receiving a second error signal representative of a second noise including a second quantization noise carried by an in-phase signal; and determining one or more bits in a polar domain, wherein the one or more bits cancel a portion of the first noise and the second noise represented by the first error signal and the second error signal. Related apparatus, systems, methods, and articles are also described.

17 Claims, 11 Drawing Sheets

POLAR NOISE SHAPING

FIELD

The subject matter described herein relates to wireless communications.

BACKGROUND

When a signal is converted from a floating point to a fixed point signal, the conversion may be performed before a digital-to-analog converter. The difference between the floating point input signal and the fixed point output signal represents an error and, in particular, quantization error, which may also be referred to as quantization noise. In radio transmitters, this quantization noise is conventionally attenuated right after the digital-to-analog converter by analog filters before the signal is up-converted into radio frequency. Rather than use analog filters, some transmitter technologies may transmit fixed point radio frequency signals including quantization noise.

SUMMARY

Methods and apparatus, including computer program products, are provided for polar noise shaping.

In one aspect there is provided a method. The method may include receiving a first error signal representative of a first noise including a first quantization noise carried by a quadrature signal; receiving a second error signal representative of a second noise including a second quantization noise carried by an in-phase signal; and determining one or more bits in a polar domain, wherein the one or more bits cancel a portion of the first noise and the second noise represented by the first error signal and the second error signal.

In some variations, one or more of the features disclosed herein including the following features can optionally be included in any feasible combination. The method may further include combining, in the polar domain, the one or more bits with the amplitude signal and the phase signal to cancel the portion. The combining may include subtracting. Two sigma delta modulators may determine from the first error signal and the second error sigma, the one or more bits. The two sigma delta modulators may include two parallel sigma delta modulators, wherein the two parallel sigma delta modulators each have a feedback gain adaptively chosen according to at least the amplitude signal, the phase signal, and one or more signs of the two parallel sigma delta modulators outputs. The feedback gain may be chosen so that it is proportional to a rectangular domain change equivalent of least significant bit changes of the amplitude signal and the phase signal. One of the gain levels may be chosen from the one or more gain levels, so that it provides a high gain in the two parallel sigma delta modulators. The two sigma delta modulators may have different non-even quantizer levels. The non-even quantizer levels may be adaptively chosen according to at least the amplitude signal, the phase signal, and the one or more signs of the two parallel sigma delta modulators outputs. The non-even quantizer levels may be chosen, such that the non-even quantizer levels may be proportional to rectangular domain change equivalents of one or more least significant bits changes of the amplitude signal and the phase signal. The first and second noise may be due in part to at least one of a regular or an irregular step size of quantized polar domain signals.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

DESCRIPTION OF THE DRAWINGS

In the drawings.

Like labels are used to refer to same or similar items in the drawings.

DETAILED DESCRIPTION

Figure 1:
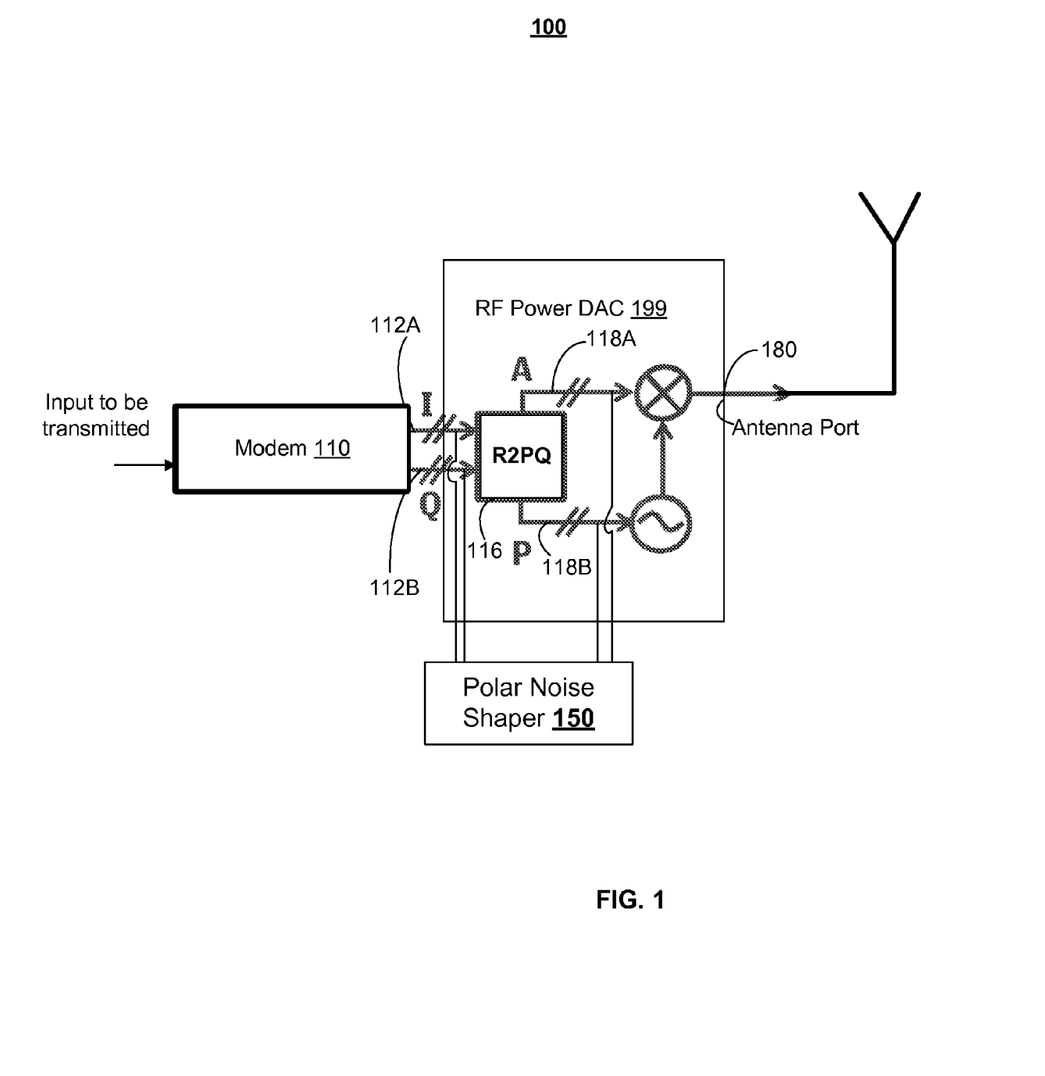
FIG. 1 depicts an example of a polar noise shaper, in accordance with some example embodiments.

FIG. 1 depicts an example of a radio frequency transmitter 100 including a modem 110 (for example, a Cartesian floating point modem and the like), a radio frequency (RF) power digital-to-analog converter (DAC) 199, and an RF polar shaper 150. The RF power DAC may perform a direct conversion of signal 112A-B as in-phase (I) and quadrature phase (Q) signals into radio frequency signal. The input 112A may represent a high bit count quantized version or floating point version of the in-phase signal, while input 112B may represent a high bit count quantized version or floating point version of the quadrature phase signal. A rectangular-to-polar quantizer (RTPQ) 116 may then convert rectangular signals 112A-B to lower bit count polar form before modulation and transmission via antenna 180.

The RF power DAC (digital-to-analog converter) may be used to transmit RF signals with the capability to choose bandwidth, carrier frequency, and/or multiple carriers flexibly, on the fly in a power efficient transmitter. However, RF power DACs may not have a conventional baseband, which can include for example baseband filtering and the like. Instead, the RF DAC brings the quantized, digital bits 118A-B to the antenna interface port 180, where these bits are converted directly into RF signal power for transmission via an antenna. As such, RF power DACs may operate in polar form, wherein a digitally controlled clock phase carries phase information and has amplitude bits that modulate clock amplitude. Because RF power DACs may not have conventional baseband analog processing, RF DACs may not allow for any baseband analog filtering to filter out noise, such as quantization noise and the like, from the signal before transmission. This quantization noise in the digital data at 118A-B and 118A-B may thus be transmitted, making it difficult for some receivers to receive relatively, weak signals in the presence of the quantization noise.

Sigma delta modulation may be used to push the quantization noise away from frequencies where a transmitted signal(s) of interest may be found. However, conventional sigma delta modulation may present problems that can make them ill-suited with respect to out-of-band noise. Specifically, some radios, such as cellular radios and the like, may be allowed to have noise where the desired signal resides, but out-of-band frequencies may be kept clean to allow reception of weaker signals. Moreover, in polar transmitters, cleaning a frequency band from noise in a phase branch or an amplitude branch does not necessarily result in substantial noise reduction in the out-of-band (OOB) frequencies.

In some example embodiments, the subject matter disclosed herein may provide a polar noise shaper 150 to modulate one or more least significant bits of the amplitude (A) signal and the phase (P) signal in order to cancel the quantization noise from the RF signal or band of interest traversing the RF power DAC. The one or more least significant bits are likely where the noise, such as quantization noise and the like, resides. Accordingly, modulation of these one or more least significant bits may be used to cancel the noise. For example, polar noise shaper 150 may modulate only the least significant bits of signals 118A-B by adding a −1 least significant bit (LSB), a 0 or +1 LSB to these signals 118A-B to cancel the noise including quantization noise.

Although some of the examples refer to modulating a single least significant bit of an amplitude signal and a single least significant bit of a phase signal, additional bits may be modulated as well to cancel (for example, reduce, shape, suppress, filter, and the like) the noise including quantization noise and the like.

The quantized digital signals 118A or 118B may, in some example embodiments, have a certain resolution, such as for example 8 bits of resolution. This 8-bit resolution may be sufficient for the desired RF signal quality, but out-of-band (OOB) noise level may require closer to about for example 22 bits or more. Given that RF power DACs are highly oversampled, the bits are generally constant over many clock cycles of the RF power DAC. The polar noise shaper 150 may modulate (for example, change, manipulate, and the like) some of least significant bits in a way that cancels the noise/quantization noise and that does not substantially affect the RF signal/band of interest.

Figure 2:
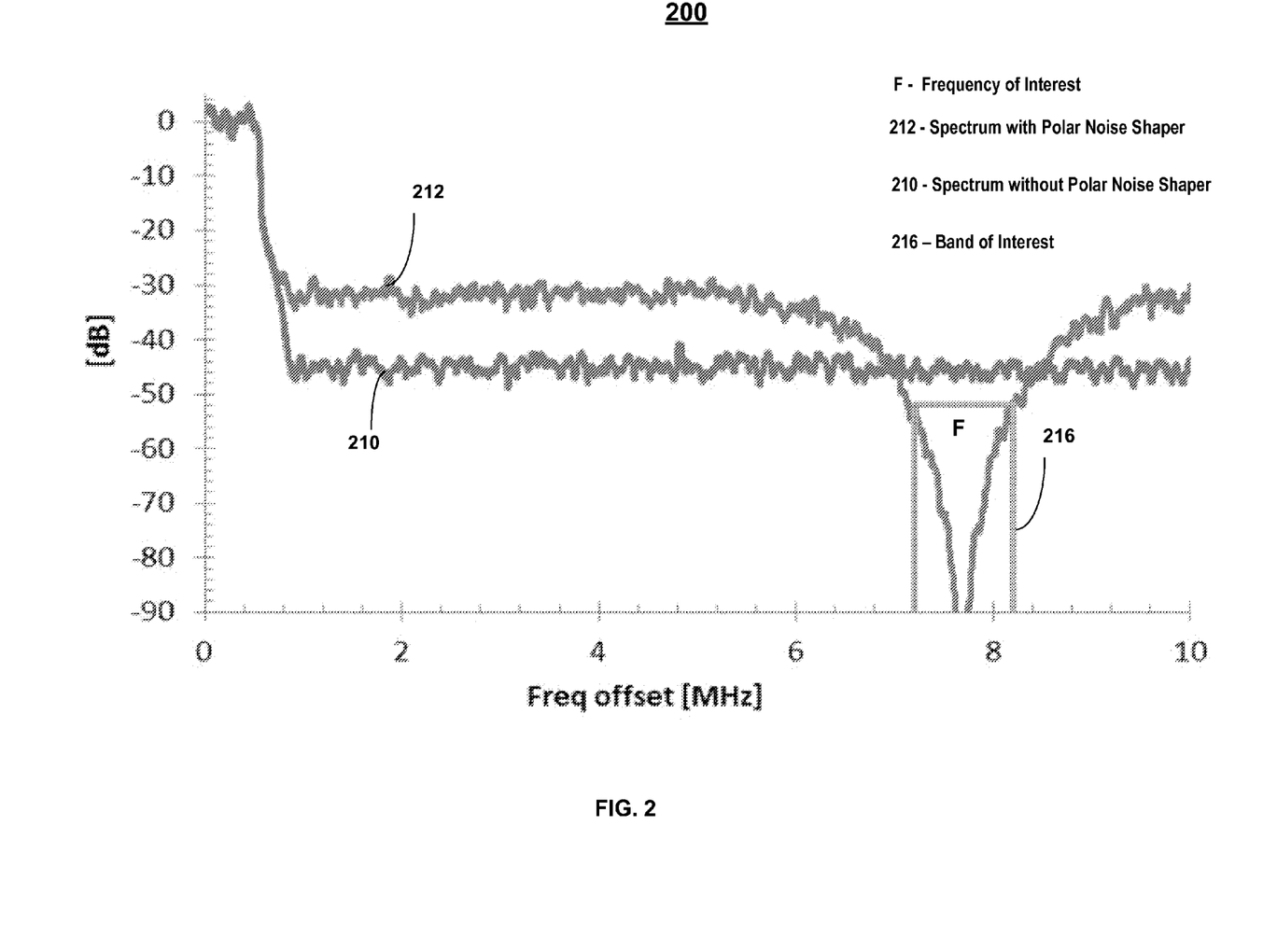
FIG. 2 depicts an example of a simulated plot of the cancelation of quantization noise provided by the polar noise shaper, in accordance with some example embodiments.

FIG. 2 depicts example spectrum plots 200 of simulated results, in accordance with some example embodiments. The transmitted signal 212 represents a signal when processed by the polar noise shaper 150, which provides one or more least significant bits to cancel the quantization noise carried by the signal 212. The effect of the cancelation within a frequency, F, is shown at 216. The noise reduction at 216 may be reduced in other portions of the spectrum as well (for example, by varying the clock frequency and resonator frequency response). In contrast, spectrum of an RF DAC without polar noise shaping is depicted by 210. It can be seen that the polar noise shaper may be used to reduce the noise at the frequency band, F 216, when compared to the level at 210.

Figure 3:
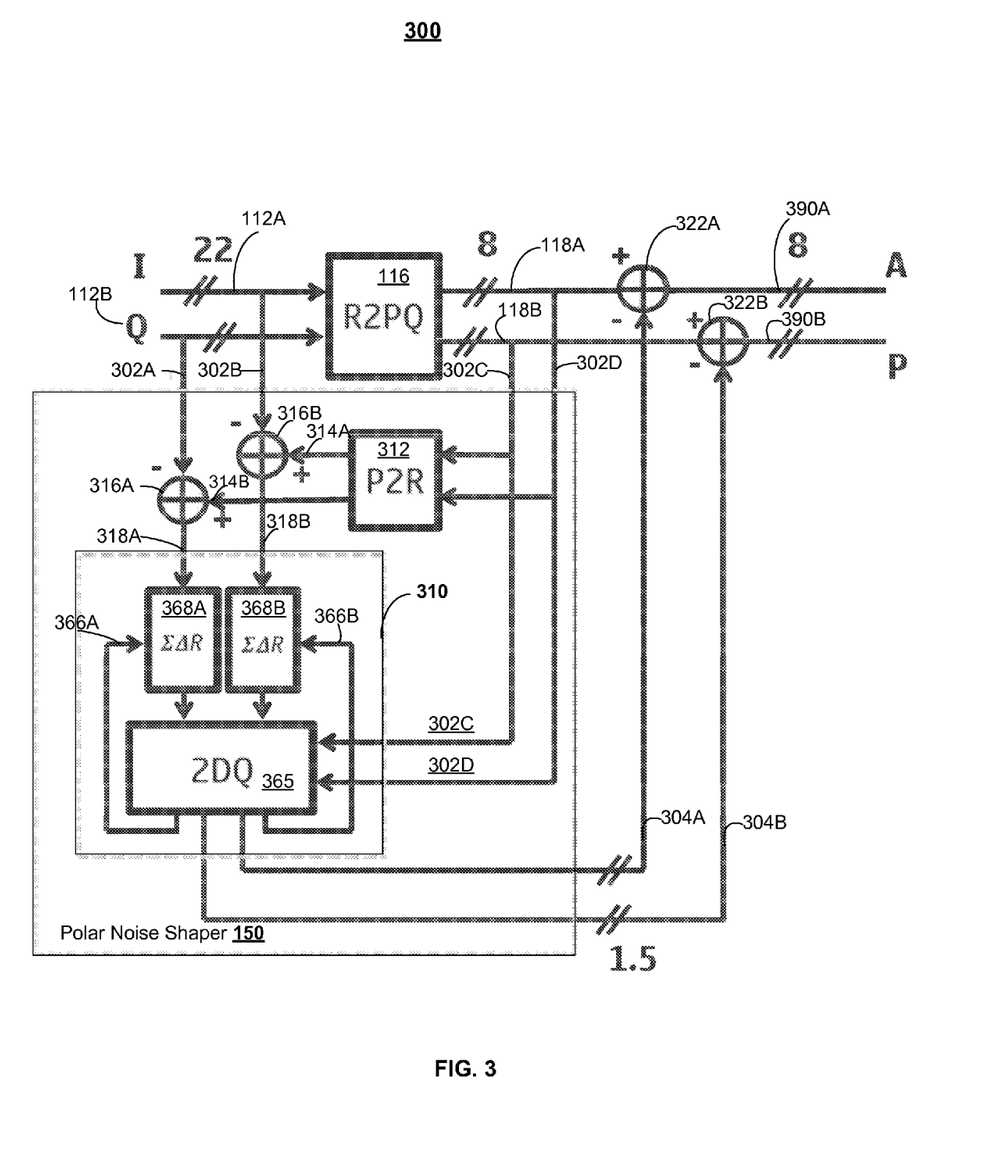
FIG. 3 depicts another example of a polar noise shaper, in accordance with some example embodiments.

FIG. 3 depicts an example implementation of the polar noise shaper 150, in accordance with some example embodiments.

The polar noise shaper 150 may have inputs 302A-D and outputs 304A-B.

Input 302A may be coupled to quadrature phase (Q) signal 112B, and input 302B may be coupled to an in-phase (I) signal 112A. Input 302D may be coupled to the amplitude (A) signal 118A, and input 302C may be coupled to phase (P) signal 118B. Output 304A may couple to a subtractor 322A, where output 304A is combined with amplitude (A) signal 118A to form amplitude output 390A, and output 304B may couple to a subtractor 322B, where output 304B is combined with phase (P) signal 118B to form phase output 390B.

The polar noise shaper 150 may, as noted, modulate one or more least significant bits of signals 118A-B, which are generated by rectangular-to-polar converter quantizer (R2PQ) 116. The modulation may, for example, comprise adding a +1 LSB, a 0, and/or a −1 LSB to quantized digital data 118A-B in order to shape a reduction in noise including the quantization noise.

Input signals 302A-B may couple to combiners 316A-B (for example, a subtractor). Combiners 316A-B may also couple to rectangular signals 314A-B, which represent input signals 302C-D after conversion to polar form by polar-to-rectangular converter 312. When rectangular signals 314A-B are subtracted at 316A-B, the signals 318A-B represent an error between the signal before and after rectangular-to-polar converter quantizer (R2PQ) 116. The outputs 318A-B represent the quantization noise (or error) for the quantization occurring at rectangular-to-polar converter quantizer 116.

The signals 318A-B (or errors) may be provided as input to a two-dimensional sigma delta modulator 310 (labeled 2DΣM), in accordance with some example embodiments. Two-dimensional sigma delta modulator 310 may also receive as input polar signals 302C-D (which may be the same or similar to signals 118A-B) generated by rectangular-to-polar converter quantizer 116.

The two-dimensional sigma delta modulator 310 may be considered two-dimensional in the sense that the two branches of sigma delta modulator 310 may not be considered to operate individually but instead operations may be influenced by the output of both modulators.

The noise, such as quantization noise and the like, caused by quantization may be measured and provided at 318A-B to the two-dimensional sigma delta modulator 310 to allow the two-dimensional sigma delta modulator 310 to generate output 304A-B, so that when combined 322A-B with polar signals 118A-B, the noise/quantization noise of signals 118A-B is canceled when transmitted via antenna port 180 and a corresponding antenna.

The two-dimensional sigma delta modulator 310 may determine the values of generated output 304A-B based on both domains. Specifically, polar noise shaper 150 including the two-dimensional sigma delta modulator 310 may receive inputs from both the rectangular (or I-Q) domain (for example, inputs 302A-B) and polar domain (inputs 302C-D). In this way, although the determination of the noise/quantization noise cancelation is in the rectangular domain at 310, the cancelation signal 304 belongs to coordinates in the polar domain.

Figure 4:
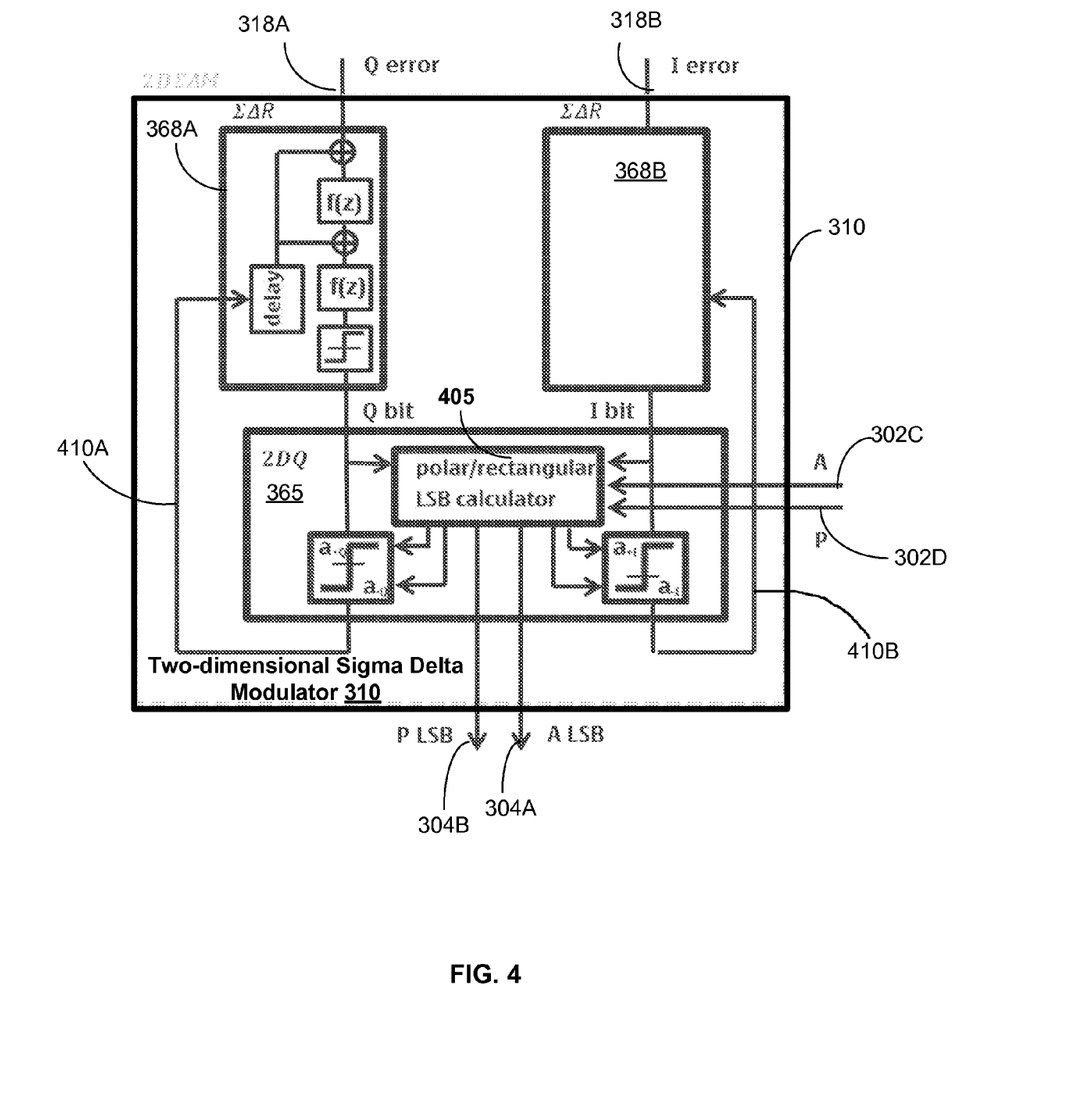
FIG. 4 depicts an example of a two-dimensional sigma delta modulator, in accordance with some example embodiments.

FIG. 4 depicts two-dimensional sigma delta modulator 310, in accordance with some example embodiments. The two-dimensional sigma delta modulator 310 may receive as inputs error signals 318A-B and polar signals 302C-D. Error signals 318A-B may be processed by sigma delta resonators 368A-B, which provides its output to two-dimensional quantizer 365. Two dimensional quantizer 365 also receives polar signals 302C-D, and calculates one or more least significant bits 304A-B that cancel chosen frequency component of the error signals 318A-B at antenna port 180 (for example, when combined at 322A-B and transmitted via antenna port 180). Because the least significant bit calculator 405 has the error signals and the polar domain information 302C-D, the calculator is able to provide one or more least significant bits 304A-B to cancel frequency components of the quantization noise (or error) at the antenna port 180 when combined at 322A-B.

Figure 5A:
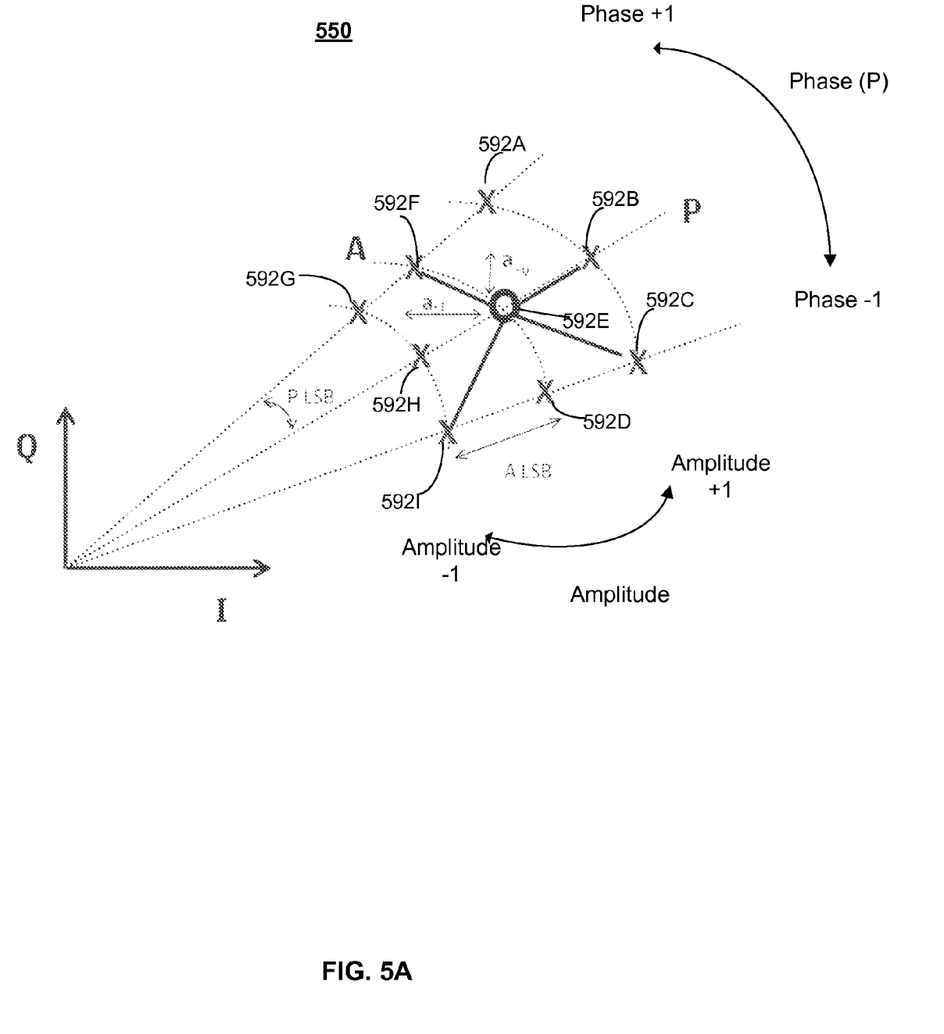
FIG. 5A depicts an example of rectangular domain to polar domain mapping, in accordance with some example embodiments.

FIG. 5A illustrates the polar/rectangular calculation performed by least significant bit calculator 405, in accordance with some example embodiments.

Figure 5B:
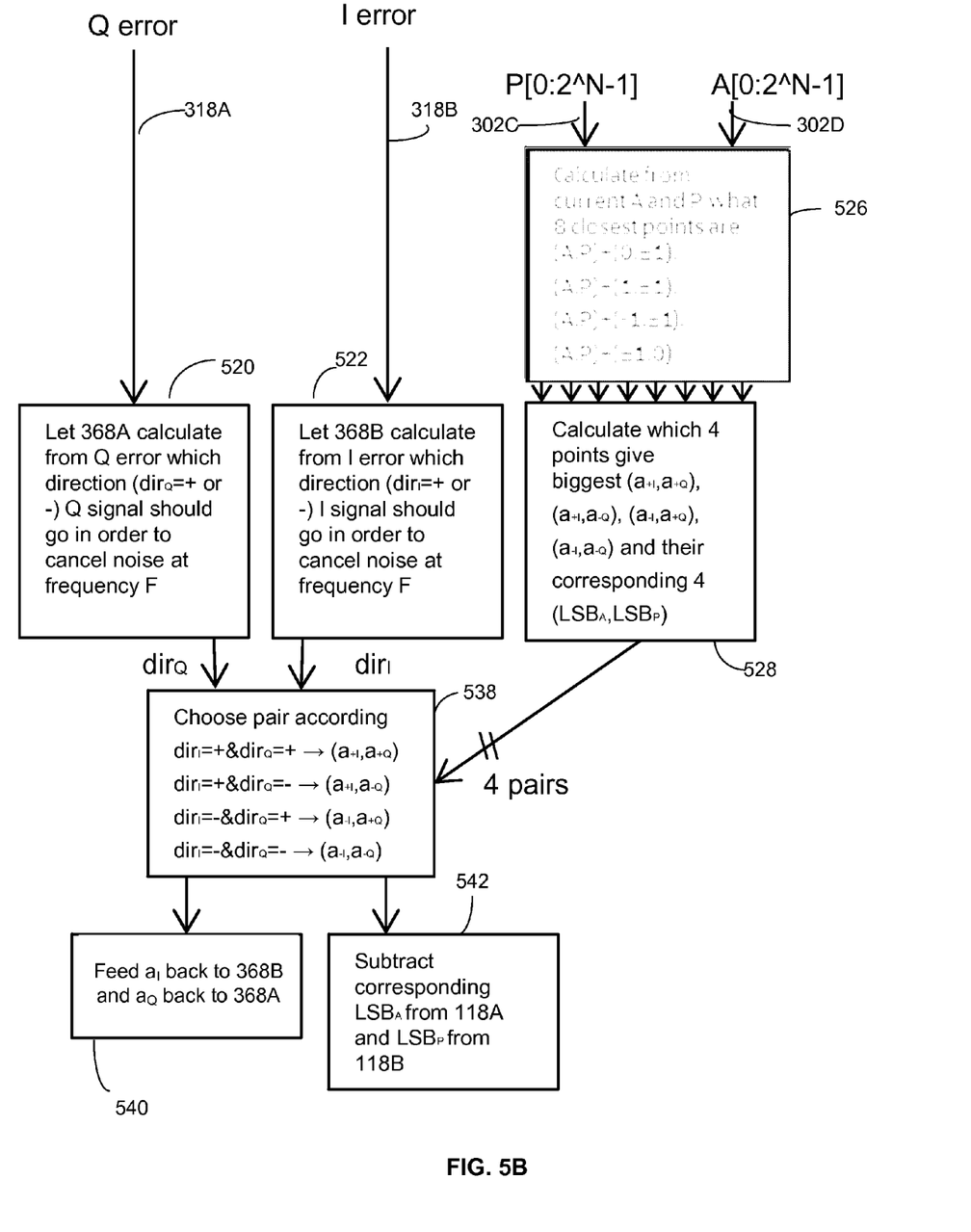
FIG. 5B depicts an example process for determining a least significant bits which can be used to cancel noise including quantization noise and the like, in accordance with some example embodiments.

In order to map the one or more least significant bits which will be used to cancel the quantization noise, these cancelation bits may be transformed into the polar domain. In the example of FIG. 5, one or more bits in the rectangular domain of I and Q may be mapped 550 into the polar domain as amplitude and phase signal 592E. The least significant bit calculator 405 may also be configured to perform this mapping. For example, in 1 LSB case, least significant bit calculator 405 may map a given point in the I and Q domain 592E to one of 8 possible polar amplitude combinations 592A-D and F-I that are on a polar domain grid. These phase amplitude combinations 592A-D and F-I represent the combinations yielded by varying phase LSB by 0, +1, or −1 and/or by varying the amplitude LSB by 0, +1, or −1. As described further with respect to FIG. 5, the least significant bit calculator 405 may select 1 of the 8 combination, so that the sign of the I/Q bit in the polar domain may be maintained. Moreover, the selection may maximize the I and Q distance (or gain), which is fed back at 410A-B to sigma delta resonators 368A-B. The sigma delta feedback gain may thus be changed according to phase, amplitude, and both resonators 368A-B outputs. The two-dimensional sigma delta modulator 310 may select quantization levels according to a current location in both coordinate systems, namely rectangular and polar.

FIG. 5B depicts an example process for canceling a portion of the noise including quantization noise carried by the least significant bits, in accordance with some example embodiments. The description of FIG. 5B also refers to FIGS. 3 and 5A.

At 520, sigma delta resonator 368A may calculate from the received Q (quadrature) error signal 318A a direction that the Q signal should go in to cancel noise at a given frequency, F. The notation $\text{dir}_Q=+$ or − refers to either a positive direction or a negative direction.

At 522, sigma delta resonator 368B may calculate from the received I (in-phase) error signal 318B a direction the I signal (see, for example, 592E at FIG. 5A) should go in to cancel noise at a given frequency, F.

At 526, the two-dimensional quantizer 365 may calculate from the current values of the polar domain amplitude and phase signal 302C-D the closest 8 points 592A-D and F-I, as shown at FIG. 5A. This points represent the amplitude and phase signal varied in the rectangular domain, such as increasing or decreasing the value of amplitude (A) or phase (P) by a value of for example plus (+) 1 or minus (−) 1, which effectively moves the amplitude and phase signal among the 8 possible values 592A-D and F-I. For example, the amplitude and phase signal 592E when increased in amplitude only by +1 moves the signal to 592B and when decreased by −1 moves the signal to 592H, while moving in phase only by +1 moves the signal to 592F and by −1 moves the signal to 592D. Moreover, if amplitude and phase signal 592E is varied in phase by −1 and amplitude by −1, the signal moves to 592I.

At 528, two-dimensional quantizer 365 may calculate which 4 points out of the 8 points 592A-D and F-I provide the biggest rectangular change or feedback signal 410A-B by changing the least significant bits the amplitude and phase signals. These 4 points provide the highest feedback gain in the sigma delta modulator 310 for any possible output value combinations from 368A and 368B.

At 538, two-dimensional quantizer 365 may choose a pair that provides the biggest feedback gain and has a direction that cancels the noise including quantization noise. For example, the least significant bit(s), $\text{LSB}_P$, for the phase signal and the least significant bit(s) of the amplitude signal $\text{LSB}_Q$ may be provided as an output at 538, which is feedback at 540 to the sigma delta resonators and forwarded, at 542, to subtractors 322A-B, where output 304A may be subtracted from amplitude signal 118A and output 304B may be subtracted from phase signal 118B.

Figure 6:
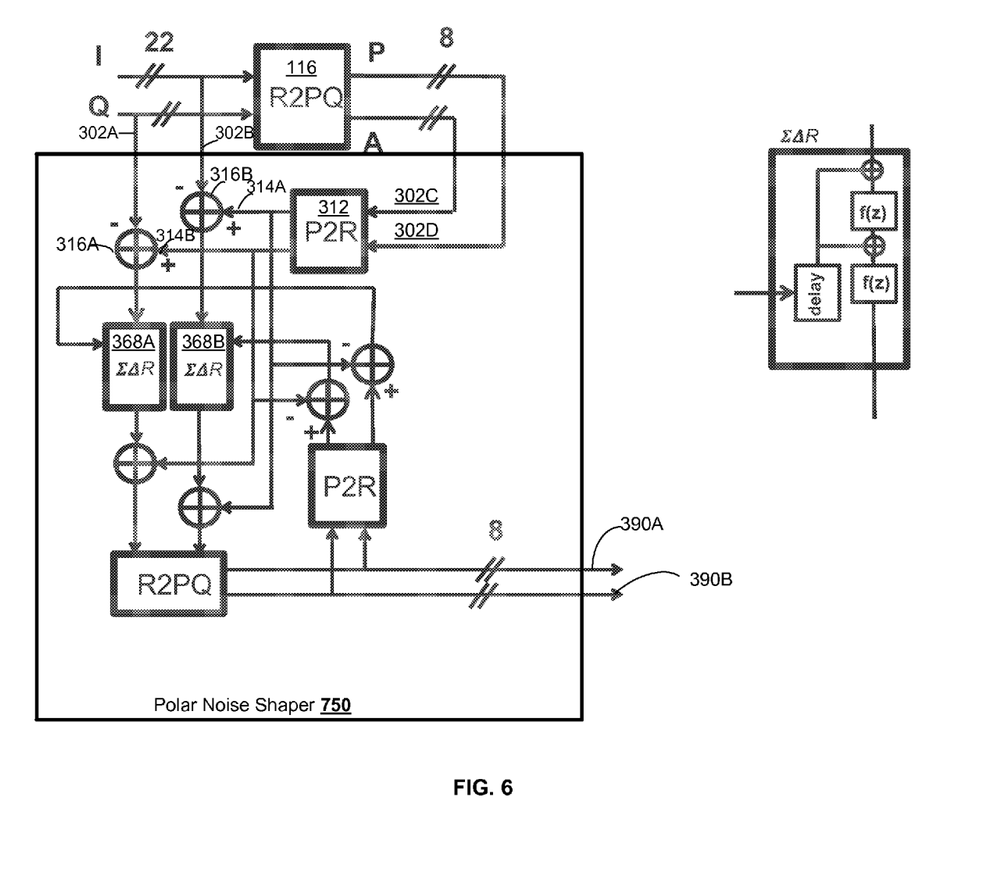
FIG. 6 depicts another example of a polar noise shaper, in accordance with some example embodiments.

FIG. 6 depicts another example of the polar noise shaper 750, in accordance with some example embodiments. The polar noise shaper 750 is similar to polar noise shaper 150 in some respects, but polar noise shaper 750 outputs are different. Rather than just outputting the least significant bits, polar noise shaper 750 outputs all of the bits (for example, most and least significant bits) of amplitude and phase signals 390A-B, which have already been modulated to reduce the quantization noise. Moreover, the sigma delta resonators, in the example of FIG. 6, may not include quantizers.

Figure 7:
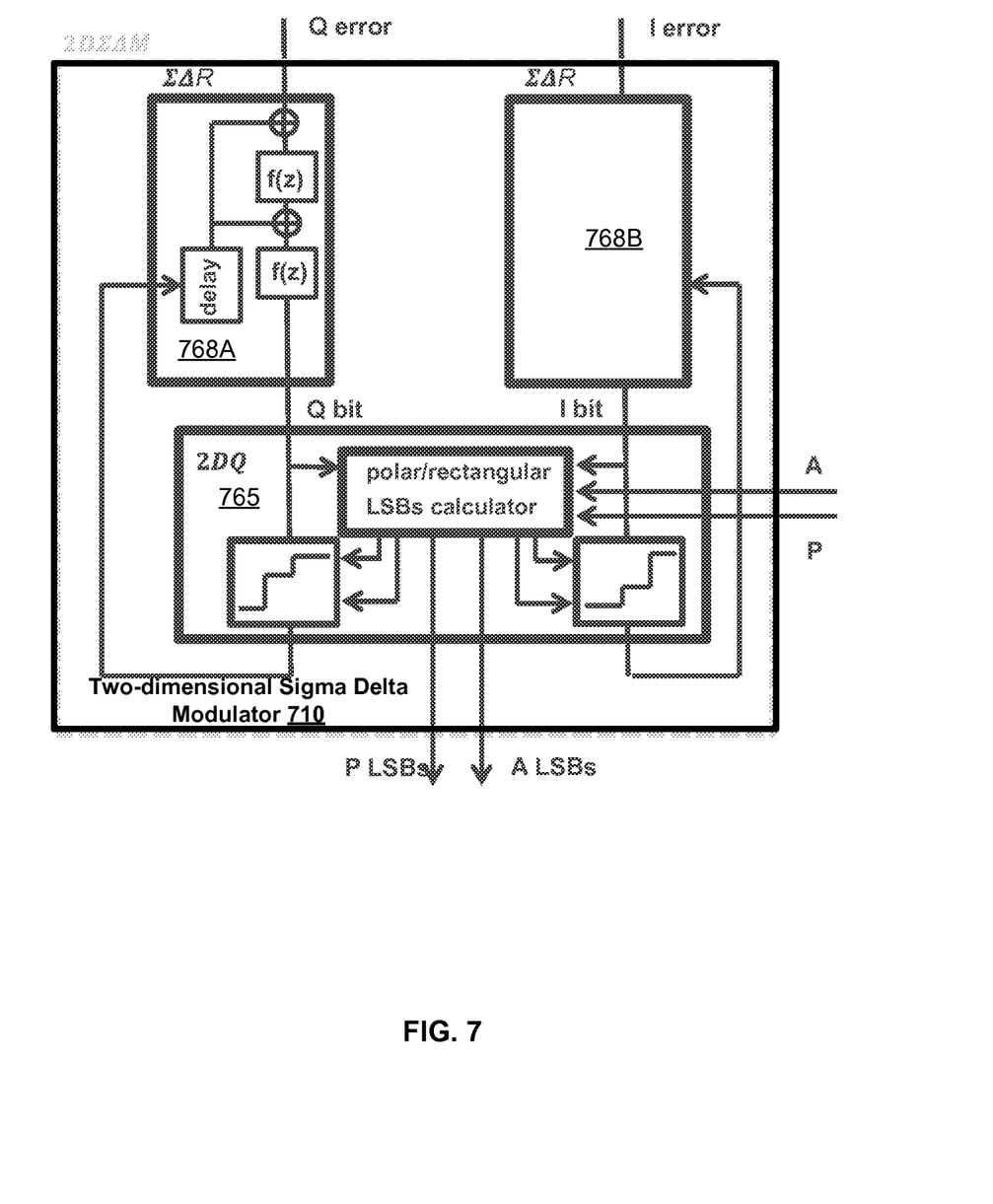
FIG. 7 depicts another example of a two-dimensional sigma delta modulator, in accordance with some example embodiments.

FIG. 7 depicts another example of multi-bit two-dimensional sigma delta modulator 710, in accordance with some example embodiments. The two-dimensional sigma delta modulator 710 of FIG. 7 is similar in some respect to the two-dimensional sigma delta modulator 310 of FIG. 4 but a quantizer has been removed from the sigma delta resonators at 768A-B and the quantization levels provided by two-dimensional quantizer 765 is increased. The multi-bit two-dimensional sigma delta modulator 710 may be used in implementations where the polar noise shaper modulates more than just the least significant bits, such as in the implementation of FIG. 4.

Figure 8:
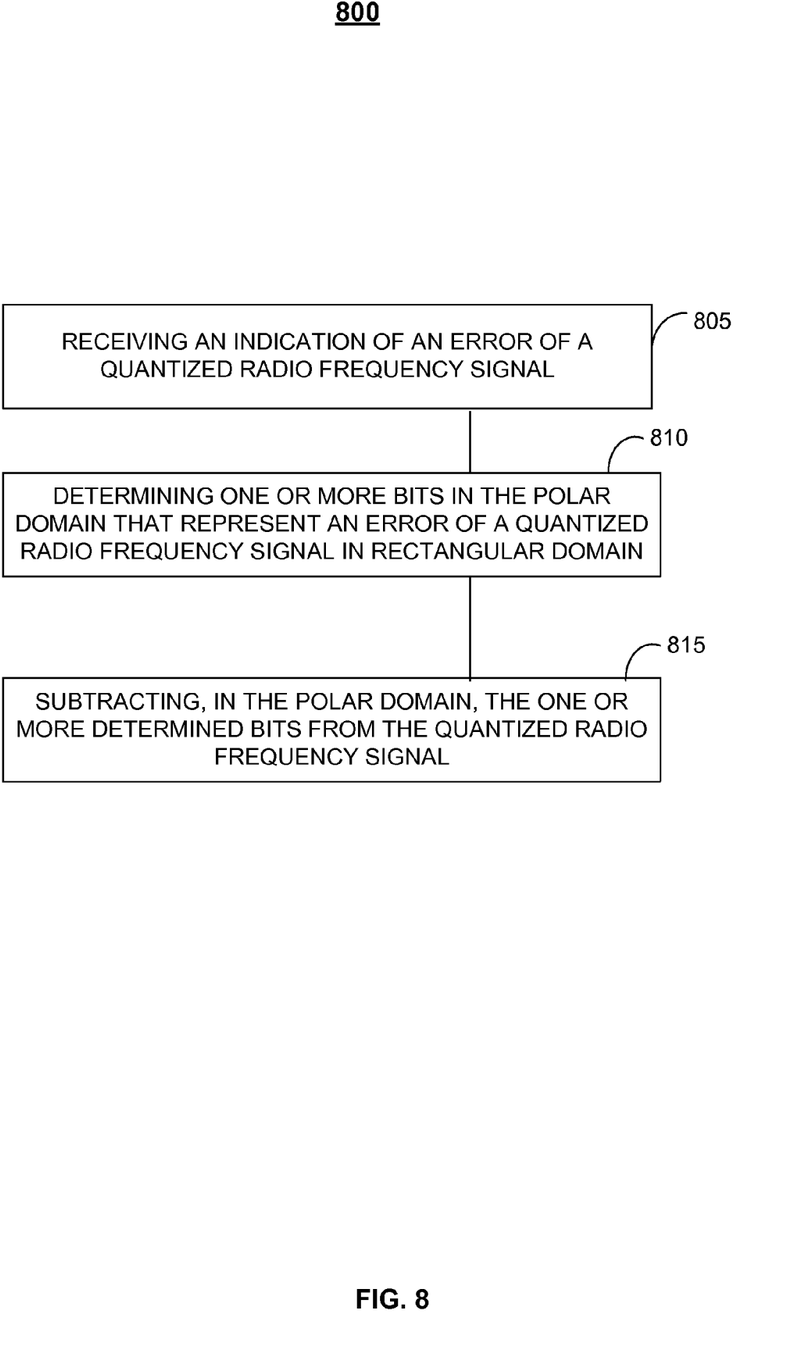
FIG. 8 depicts an example process for polar noise shaping, in accordance with some example embodiments.

FIG. 8 depicts a process 800 for polar noise shaping, in accordance with some example embodiments.

At 805, an error indication of quantization error in a quantized radio frequency signal may be received, in accordance with some example embodiments. The error indication may, in some example embodiments, comprise a quadrature phase error, such as quantization error 318A and an in-phase error, such as in-phase error 318B.

At 810, a determination may be made of one or more bits in the polar domain that represent an error of a quantized radio frequency signal in rectangular domain, in accordance with some example embodiments. For example, polar noise shaper 150/350 including two-dimensional sigma delta modulator may determine one or more least significant bits which when combined in the polar domain with the quantized phase and amplitude signals 118A-B cancels the quantization noise at antenna port 180 at a given frequency band. These one or more least significant bits may be determined in the rectangular domain to provide the cancellation, but the location stays in the polar domain. Moreover, the sign of the correcting signal may be determined in rectangular domain, while the magnitude of the correction is determined by polar domain.

At 815, the one or more determined bits 304A-B may be combined, such as subtracted in the polar domain with the bits of the quantized radio frequency signal 118A-B, in accordance with some example embodiments. For example, the determined least significant bit 304A for the amplitude signal may be subtracted at 322A from the amplitude signal 118A, and the determined least significant bit 304B for the phase signal may be subtracted at 322B from the phase signal 118B. When this is the case, subtractors 322A-B output signals 390A-B with new phase and amplitude signals that produce noise cancellation when modulated and transmitted via 180 as shown for example at FIG. 2 at 216.

Although the previous example describes cancelation using a single bit, the cancelation may, as noted, use additional bits as well.

In some example embodiments, the polar noise shaper 150 may be used for predistortion. Predistortion may be used when power components are non-linear. Non-linearity creates noise, so polar noise shaper 150 may remove this noise as well. If the non-linearity is known, it can be corrected by including the error from nonlinearity in the error signal of the polar noise shaper, so that at a given frequency of interest the noise due to predistortion may be canceled.

Figure 9:
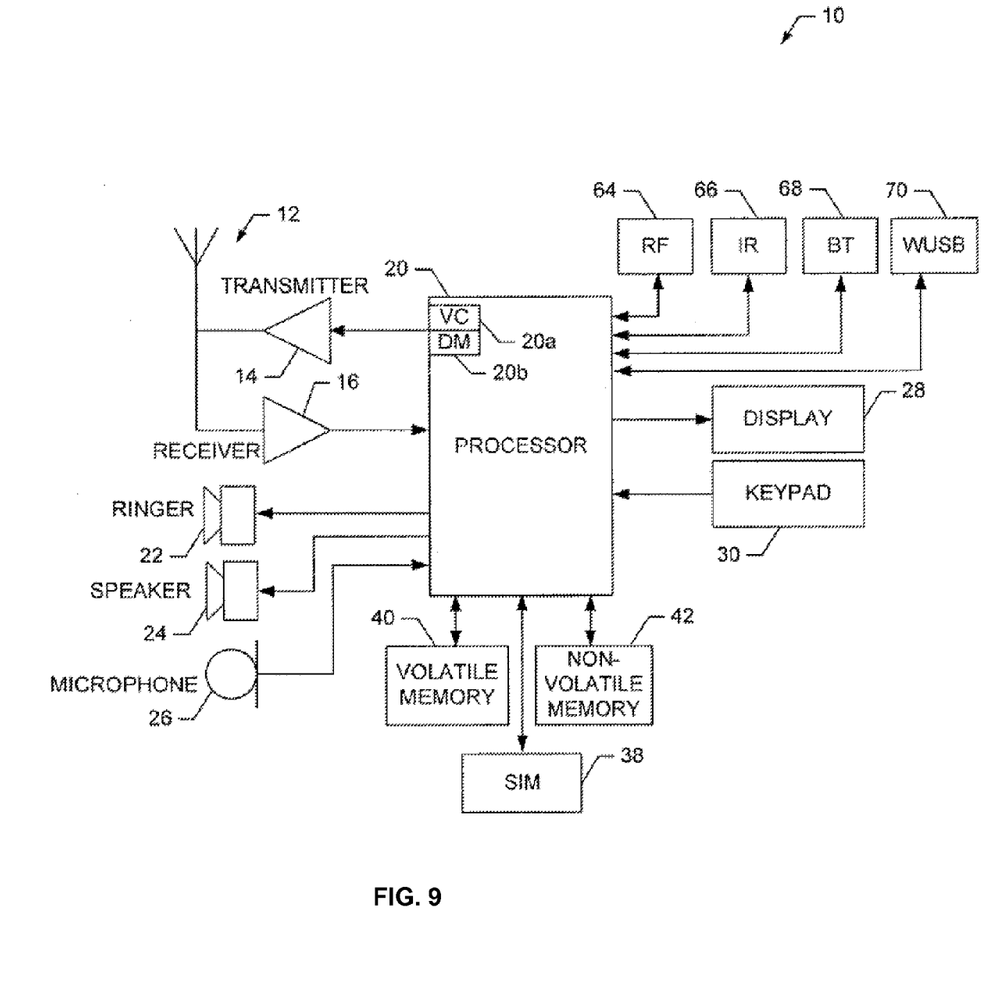
FIG. 9 depicts an example of a user equipment, in accordance with some example embodiments.

FIG. 9 illustrates a block diagram of an apparatus 10, which can be configured as a user equipment, in accordance with some example embodiments. The user equipment may be implemented as a smart phone, mobile station, a mobile unit, a subscriber station, a wireless terminal, a tablet, a wireless plug-in accessory, or any other device with a short-range transceiver, such as Bluetooth, Bluetooth Low Energy, and the like.

The apparatus 10 may include at least one antenna 12 in communication with a transmitter 14 and a receiver 16. Alternatively transmit and receive antennas may be separate.

In some example embodiments, the transmitter 14 may include, or be coupled to, polar noise shaper 150 disclosed herein, although the polar noise shaper may be used in other locations in a radio as well.

For example, the polar noise shaper may be implemented by a processor, such as process 20 and/or a digital signal processor, and the like. The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 9 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 9, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth (BT) transceiver 68 operating using Bluetooth wireless technology, a wireless universal serial bus (USB) transceiver 70, a Bluetooth Low Energy link, ZigBee link, a cellular device-to-device link, a wireless local area link, a Wi-Fi link, and/or any other short-range radio technology. In this regard, the apparatus 10 and, in particular, the short-range transceiver may be capable of transmitting data to and/or receiving data from electronic devices within the proximity of the apparatus, such as within 10 meters, for example. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), an eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 10. The functions may include one or more of the operations disclosed herein with respect to the user equipment including polar noise shaper 150, such as the functions disclosed at process 800 and the like. The memories may comprise an identifier, such as an international mobile equipment identification (IMEI) code, capable of uniquely identifying apparatus 10. In the example embodiment, the processor 20 may be configured using computer code stored at memory 40 and/or 42 to operations disclosed herein with respect to the polar noise shaper 150, such as the functions disclosed at process 800 and the like.

Figure 10:
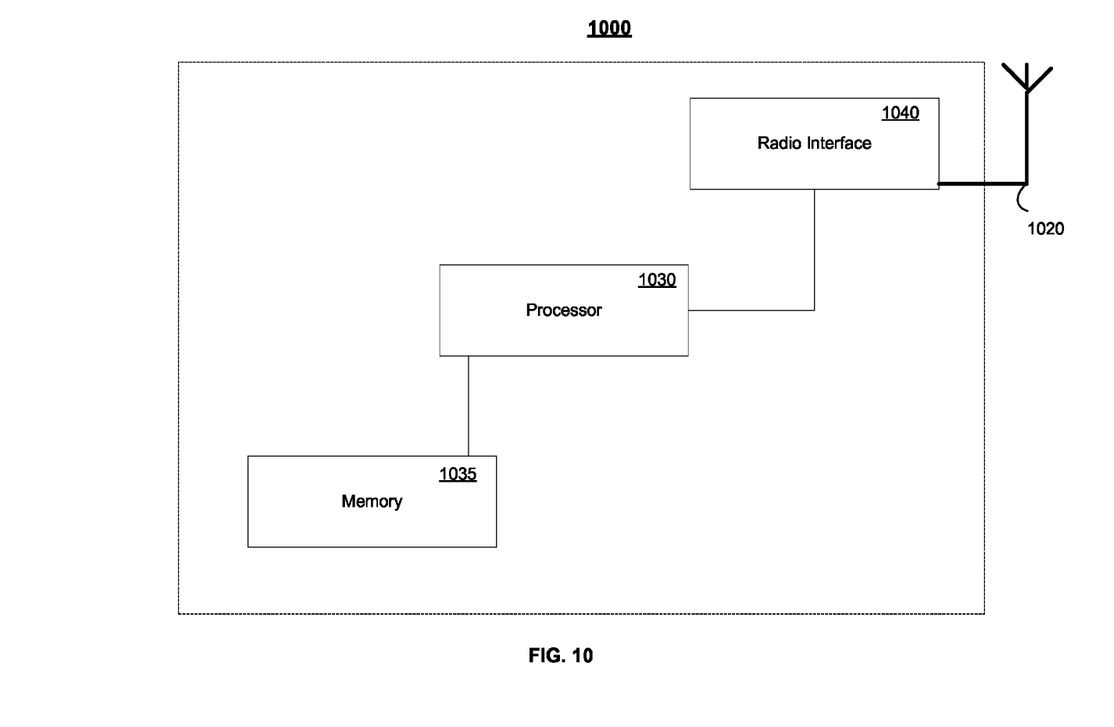
FIG. 10 depicts an example of a network node, in accordance with some example embodiments.

FIG. 10 depicts an example implementation of a network node 100, such as for example base station, an access point, and the like. The network node 1000 may include one or more antennas 1020 configured to transmit via a downlink and configured to receive uplinks via the antenna(s) 1020. The network node 1000 may further include a plurality of radio interfaces 1040 coupled to the antenna 1020. The radio interfaces may correspond one or more of the following: Long Term Evolution (LTE, or E-UTRAN), Third Generation (3G, UTRAN, or high speed packet access (HSPA)), Global System for Mobile communications (GSM), wireless local area network (WLAN) technology, such as for example 802.11 WiFi and/or the like, Bluetooth, Bluetooth low energy (BT-LE), near field communications (NFC), and any other radio technologies. The radio interfaces 1040 may further include other components, such as for example filters, converters (for example, digital-to-analog converters and the like), mappers, a Fast Fourier Transform (FFT) module, and the like, to generate symbols for a transmission via one or more downlinks and to receive symbols (for example, via an uplink). In some example embodiments, the radio interfaces 1040 may further include polar noise shaper 150.

The network node 1000 may further include one or more processors, such as for example processor 1030, for controlling the network node 1000 and for accessing and executing program code stored in memory 1035. In some example embodiments, memory 1035 includes code, which when executed by at least one processor causes one or more of the operations described herein with respect to network node including the polar shaper disclosed herein. For example, network node 1000 including polar shaper may perform operations disclosed herein with respect to the polar noise shaper 150, such as the functions disclosed at process 800 and the like.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIGS. 9 and 10 computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing below, a technical effect of one or more of the example embodiments disclosed herein is enabling RF power DACs to be used in user equipment and other radios, systems, and the like in which OOB noise may be kept relatively low.

If desired, the different functions discussed herein may be performed in a different order and/or concurrently with each other. Furthermore, if desired, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the present invention as defined in the appended claims. Other embodiments may be within the scope of the following claims. The term "based on" includes "based on at least." The use of the phase "such as" means "such as for example" unless otherwise indicated.

What is claimed:

1. A method comprising:
   receiving a first error signal representative of a first noise including a first quantization noise carried by a quadrature signal;
   receiving a second error signal representative of a second noise including a second quantization noise carried by an in-phase signal;
   determining one or more least significant bits that cancel at least a portion of the first noise and the second noise represented by the first error signal and the second error signal, wherein the one or more least significant bits are determined, by at least two parallel sigma delta modulators, from at least the first error signal and the second error signal, wherein the two parallel sigma delta modulators determine, in a rectangular domain, an amount needed to cancel the first noise and the second noise, and convert, into a polar domain, the amount to the one or more least significant bits; and
   combining, in the polar domain, the one or more least significant bits with an amplitude signal and a phase signal to cancel the portion of the first noise and the second noise.

2. The method of claim 1, wherein the combining comprises subtracting, in the polar domain, the one or more least significant bits with the amplitude signal and the phase signal to cancel the portion of the first noise and the second noise.

3. The method of claim 1, wherein the two parallel sigma delta modulators each have a feedback gain adaptively chosen according to at least the amplitude signal, the phase signal, and one or more signs of outputs of the two parallel sigma delta modulators.

4. The method of claim 3 further comprising:
   choosing the feedback gain proportional to a rectangular domain change equivalent of one or more least significant bit changes of the amplitude signal and the phase signal.

5. The method of claim 3 further comprising:
   choosing from one or more gain levels, one of the gain levels providing a high gain in the two parallel sigma delta modulators.

6. The method of claim 1, wherein the two parallel sigma delta modulators have different non-even quantizer levels, and wherein the non-even quantizer levels are adaptively chosen according to at least the amplitude signal, the phase signal, and one or more signs of outputs of the two parallel sigma delta modulators.

7. The method of claim 6 further comprising:
   choosing the non-even quantizer levels, such that the non-even quantizer levels are proportional to rectangular domain change equivalents of the changes of the one or more least significant bits of the amplitude signal and the phase signal.

8. The method of claim 1, wherein the first noise or the second noise is due in part to at least one of a regular or an irregular step size of quantized polar domain signals.

9. The method of claim 1, wherein the conversion into the amount is based at least on polar domain feedback signals.

10. An apparatus comprising:
    at least one processor circuitry; and
    at least one memory circuitry including computer program code, the at least one memory circuitry and the computer program code configured to, with the at least one processor circuitry, cause the apparatus configured to perform at least the following:
    receive a first error signal representative of a first noise including a first quantization noise carried by a quadrature signal;
    receive a second error signal representative of a second noise including a second quantization noise carried by an in-phase signal;
    determine one or more least significant bits that cancel at least a portion of the first noise and the second noise represented by the first error signal and the second error signal, wherein the one or more least significant bits are determined, by at least two parallel sigma delta modulators, from at least the first error signal and the second error signal, wherein the two parallel sigma delta modulators determine, in a rectangular domain, an amount needed to cancel the first noise and the second noise, and convert, into a polar domain, the amount to the one or more least significant bits; and
    combine, in the polar domain, the one or more least significant bits with an amplitude signal and a phase signal to cancel the portion of the first noise and the second noise.

11. The apparatus of claim 10, wherein the combine is configured to include a subtract, in the polar domain, the one or more least significant bits with the amplitude signal and the phase signal to cancel the portion of the first noise and the second noise.

12. The apparatus of claim 10, wherein the two parallel sigma delta modulators each have a feedback gain adaptively chosen according to at least the amplitude signal, the phase signal, and one or more signs of outputs of the two parallel sigma delta modulators.

13. The apparatus of claim 12, wherein the apparatus is further configured to at least choose the feedback gain proportional to a rectangular domain change equivalent of one or more least significant bit changes of the amplitude signal and the phase signal.

14. The apparatus of claim 12, wherein the apparatus is further configured to at least choose from one or more gain levels, one of the gain levels providing a high gain in the two parallel sigma delta modulators.

15. The apparatus of claim 10, wherein the two sigma delta modulators have different non-even quantizer levels, and wherein the non-even quantizer levels are adaptively chosen according to at least the amplitude signal, the phase signal, and one or more signs of outputs of the two parallel sigma delta modulators.

16. The apparatus of claim 15, wherein the apparatus is further configured to at least choose the non-even quantizer levels, such that the non-even quantizer levels are proportional to rectangular domain change equivalents of the changes of the one or more least significant bits of the amplitude signal and the phase signal, wherein the first noise or the second noise is due in part to at least one of a regular or an irregular step size of quantized polar domain signals.

17. A non-transitory computer-readable storage medium including computer program code, which when executed by at least one processor circuitry causes operations comprising:

receiving a first error signal representative of a first noise including a first quantization noise carried by a quadrature signal;

receiving a second error signal representative of a second noise including a second quantization noise carried by an in-phase signal;

determining one or more least significant bits that cancel at least a portion of the first noise and the second noise represented by the first error signal and the second error signal, wherein the one or more least significant bits are determined, by at least two parallel sigma delta modulators, from at least the first error signal and the second error signal, wherein the two parallel sigma delta modulators determine, in a rectangular domain, an amount needed to cancel the first noise and the second noise, and convert, into a polar domain, the amount to the one or more least significant bits; and combining, in the polar domain, the one or more least significant bits with an amplitude signal and a phase signal to cancel the portion of the first noise and the second noise.

* * * * *